United States Patent [19]

Maeda et al.

[11] Patent Number: 4,976,216
[45] Date of Patent: Dec. 11, 1990

[54] APPARATUS FOR VAPOR-PHASE GROWTH

[75] Inventors: Takayoshi Maeda, Mie; Masahiko Hata, Osaka; Yasunari Zempo, Osaka; Noboru Fukuhara, Osaka; Hiroaki Takata, Osaka, all of Japan

[73] Assignee: Sumitomo Chemical Co., Ltd., Osaka, Japan

[21] Appl. No.: 269,348

[22] Filed: Nov. 10, 1988

[30] Foreign Application Priority Data

Nov. 11, 1987 [JP] Japan .................. 62-285938

[51] Int. Cl.$^5$ ............................................ C23C 16/00
[52] U.S. Cl. ................................... 118/728; 118/715; 118/725; 118/730
[58] Field of Search ................ 118/715, 730, 725, 728

[56] References Cited

U.S. PATENT DOCUMENTS 4,596,208  6/1986  Wolfson et al. .
4,638,762  1/1987  Kim et al. .

FOREIGN PATENT DOCUMENTS 0131208   1/1985  European Pat. Off. .
0147967   7/1985  European Pat. Off. .
60-119711 6/1985  Japan ................................ 118/715
61-194838 8/1986  Japan ................................ 118/715
6273708   4/1987  Japan .
62128114  6/1987  Japan .
1032102   6/1966  United Kingdom .
1160162   7/1969  United Kingdom .
1281539   7/1972  United Kingdom .
1462253   1/1977  United Kingdom .

OTHER PUBLICATIONS

British Search Report.

Primary Examiner—Richard Bueker
Attorney, Agent, or Firm—Sughrue, Mion, Zinn, Macpeak & Seas

[57] ABSTRACT

In an apparatus for vapor-phase growth which comprises a reactor having an inlet for the introduction of the gas containing a source material on its top and a susceptor provided in the downstream portion of the reactor, the improvement wherein the susceptor is generally in a conical or polygonal pyramid form consisting of an upper rectifying portion and a lower substrate holding portion, with the diameter of the susceptor in its lower portion increasing by a greater degree than in its upper portion.

4 Claims, 2 Drawing Sheets

APPARATUS FOR VAPOR-PHASE GROWTH

FIELD OF THE INVENTION

The present invention relates to an apparatus for vapor-phase growth of a thin semiconductor film. More particularly, the present invention relates to an apparatus for vapor-phase growth that inhibits the turbulence of the gas containing a source material introduced into a reactor through an entrance channel, thereby improving the source material efficiency and the uniformity in distribution of thickness of the thin semiconductor film to be grown on a substrate.

BACKGROUND OF THE INVENTION

Films of semiconductors of, e.g., silicon or of compounds of the Groups III and V (e.g., gallium arsenide) can be grown in the vapor phase by introducing the gas containing a source material into a reactor from the top and allowing the material to be reacted or decomposed on a substrate held on a heated susceptor. For this purpose, a variety of apparatuses have been proposed that are capable of forming thin semiconductor films by vapor-phase growth. An example of one such prior art apparatuses for vapor-phase growth is shown in FIG. 1. It comprises a barrel type reactor 1 having on its top an inlet 2 through which the gas containing a source material is introduced, and a barrel type susceptor 3 in a generally conical or polygonal pyramid form that is positioned below the inlet 2 and whose diameter increases toward the downstream portion of the reactor 1. This susceptor 3 is supported on a rotatable shaft 6 and consists essentially of an upper rectifying portion 4 and a lower substrate holding portion 5. A plurality of substrates 7 are placed on the inclined surfaces of the holding portion 5. A radiofrequency (RF) induction coil 8 is mounted around the reactor 1 and the susceptor 3 is heated to a predetermined temperature by RF induction heating with this coil 8. The gas containing a source material is introduced into the reactor 1 together with a carrier gas through the inlet 2 on its top and they undergo pyrolysis reaction in the vicinity of the surface of the heated susceptor 3, thereby allowing a thin semiconductor film to be grown on the substrates 7. The unreacted source material is discharged together with the carrier gas through an exhaust port 9.

The present inventors conducted experiments of vapor-phase growth with the above-described barrel type apparatus and found the following: since the diameter of the susceptor increases by a progressively decreasing degree toward the base, the main stream of the gases flowing between the inner surface of the reactor and the outer surface of susceptor would come closer to the reactor wall by the inertia force and the greater part of the source material would be discharged without reacting through the exhaust port, thereby reducing the efficiency of their utilization. The present inventors also found that the main stream of the gases flow inclined to the reactor wall more conspicuously since the expansion of gas flow whose kinematic viscosity would be increased at higher temperatures was larger on the susceptor side than on the reactor wall side, and this led to a greater decrease in the efficiency of utilization of the source material. In addition, the chance of natural convection of occurring in the space between the reactor wall and the susceptor, namely, the formation of an ascending stream along the susceptor surface, was increased, causing nonuniformity in the thickness of growing film, thereby rendering it very difficult to obtain a profile having an abrupt interface.

SUMMARY OF THE INVENTION

An object, therefore, of the present invention is to provide an apparatus for vapor-phase growth that is free from the aforementioned problems of the prior art.

This object of the present invention can be attained by an apparatus for vapor-phase growth which comprises a barrel type reactor having an inlet for the introduction of the gas containing a source material on its top and a susceptor provided in the downstream portion of the reactor, characterized in that said susceptor is generally in a conical or polygonal pyramid form consisting of an upper rectifying portion and a lower substrate holding portion, with the diameter of said susceptor in its lower portion increasing by a greater degree than in its upper portion.

As a result of intensive studies conducted under the above-described circumstances of the prior art, the present inventors found that the problems associated with it could be solved by employing a susceptor in a specified form.

DETAILED DESCRIPTION OF THE INVENTION

Several embodiments of the present invention are described below with reference to FIGS. 2 to 7.

Figure 2:
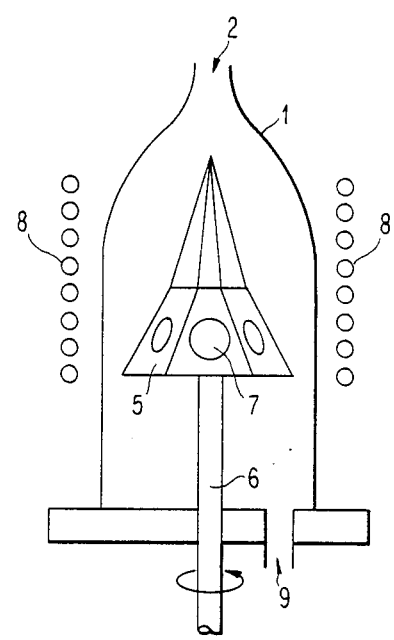
FIGS. 2 to 4 show schematically the apparatus for vapor-phase growth according to three different embodiments of the present invention.

FIG. 2 shows schematically an apparatus for vapor-phase growth according to an embodiment of the present invention. A source material for vapor-phase growth is introduced into a reactor 1 through an inlet 2 together with a carrier gas. The reactor 1 contains a susceptor 3 in a polygonal pyramid form that is supported on a rotatable shaft 6. The susceptor consists essentially of an upper rectifying portion 4 and a lower substrate holding portion 5 whose diameter increases by a greater degree than that of the rectifying portion 4. The susceptor 3 is adapted for radiofrequency induction by an externally wound RF coil 8. The main stream of the gas introduced into the reactor 1 flows nearly as a laminar flow in the space between the rectifying portion 4 of the susceptor 3 and the inner wall of the reactor 1, particularly in the vicinity of the outer surface of the rectifying portion 4. As a result, the thermal decomposition reaction of the source material takes place in the vicinity of the surfaces of substrates 7 placed on the substrate holding portion 5, allowing a thin film of the semiconductor crystal to be grown on the substrates 7. The substrates 7 are usually arranged in a zone on the inclined surfaces of the holding portion 5 which is concentric with the central axis of the susceptor 3 as viewed from its top. The unreacted gases and the gases that have been generated during the reaction are discharged from the reactor 1 through a basal exhaust port 9.

Figure 6:
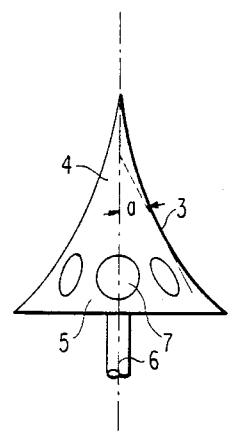

The degree by which the diameter of the susceptor increases is indicated by gradient a of a certain point on the surface of the susceptor as measured from its rotatable shaft 6 as illustrated in FIG. 6.

In the apparatus for vapor-phase growth of the present invention, the turbulence that would otherwise be introduced in the stream of gas containing a source material flowing in the vicinity of the susceptor 3 is sufficiently inhibited to improve both the source material efficiency and the uniformity in the thickness of a growing semiconductor film.

Figure 3:
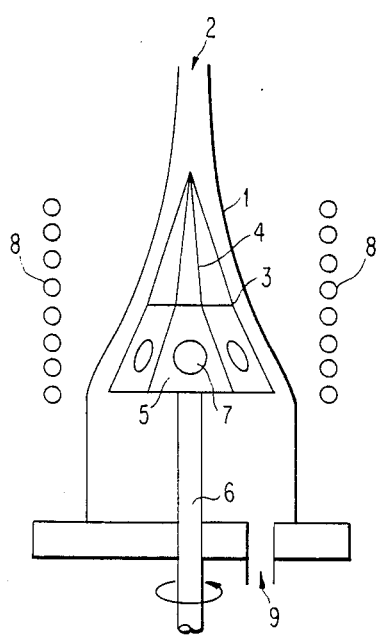
Figure 4:
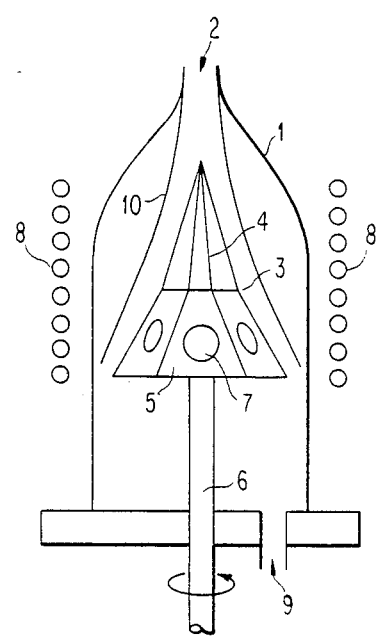

FIG. 3 is a schematic diagram showing an apparatus for vapor-phase growth according to another embodiment of the present invention. In this embodiment, the diameter of the reactor 1 in the portion surrounding the susceptor 3 increases by a progressively increasing degree from its top downward. FIG. 4 shows an embodiment in which an additional rectifying tube 10 is contained in the reactor 1, with its diameter increasing by a progressively increasing degree from its top downward. This embodiment is preferred over the apparatus shown in FIG. 2 in that it allows a greater amount of the gas containing a source material to flow closely to the surface of the susceptor, thereby achieving further improvement in the source material efficiency.

Figure 5:
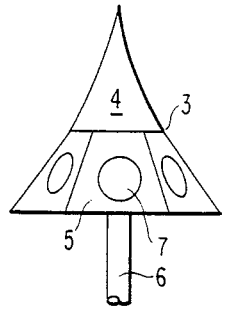
FIGS. 5 and 6 show schematically two different examples of susceptor design for use in the apparatus for vapor-phase growth of the present invention.

FIGS. 5 and 6 show other examples of the design of susceptor 3. The susceptor shown in FIG. 5 consists of a conical rectifying portion 4 and a substrate holding portion 5 in a polygonal pyramid form. In the susceptor shown in FIG. 6, both of the rectifying portion 4 and the substrate holding portion 5 are in a conical form. The diameter of the susceptor 3 for use in the apparatus of the present invention may increase in various ways. For example, it may increase either continuously or stepwise by a progressively increasing degree from the top of the susceptor downward. Alternatively, both of the rectifying portion 4 and the holding portion 5 may increase in diameter by a constant degree, or the diameter of either one portion may increase by a progressively increasing degree from its top downward. These embodiments may be combined in various ways so long as the diameter of the holding portion 5 increases by a greater degree than the rectifying portion 4.

A substrate is placed on the substrate holding portion 5 at an angle of from 15° to 80°, preferably from 20° to 75° and more preferably from 35° to 70° to the horizontal plane.

Figure 1:
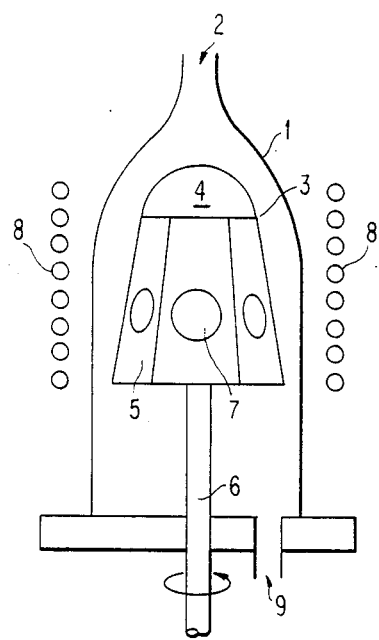
FIG. 1 is a schematic diagram of a prior art apparatus for vapor-phase growth.
Figure 7:
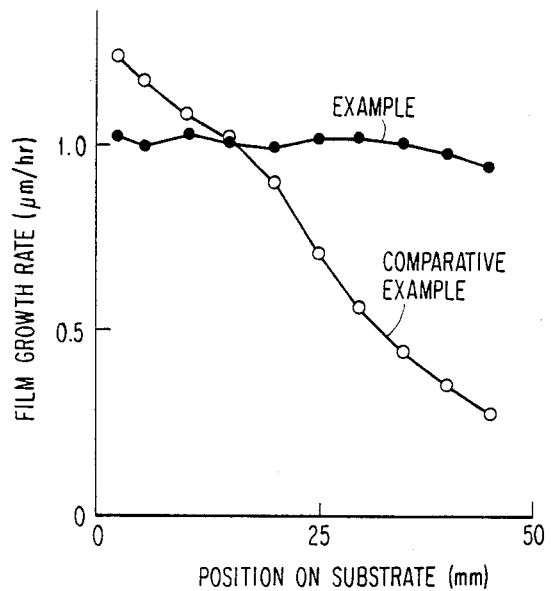
FIG. 7 is a graph showing the film growth rate vs position on the substrate surface profiles as obtained when semiconductor films were grown in the vapor phase by the apparatus shown in FIGS. 1 and 3.

The uniformity in the rate of film growth with the apparatus of the present invention was investigated by the following procedure. The susceptor 3 employed in this experiment was in an octagonal pyramid form which was similar to that incorporated in the apparatus shown in FIG. 3; it consisted of a rectifying portion 4 having a height of 120 mm and a maximum diameter of 84 mm, and a substrate holding portion 5 having a height of 120 mm and a maximum diameter of 200 mm. Eight GaAs substrates each having a diameter of 2 inches were placed on the inclined surfaces of the holding portion 5. Trimethyl gallium (TMG) as a group III material and arsine ($AsH_3$) as a group V material were diluted with high-purity hydrogen and the resulting gases of source materials (TMG molar fraction $=1.1\times10^{-5}$ mol/l; $AsH_3$/TMG molar ratio $=30/1$) were introduced into the reactor 1 through an inlet 2. The GaAs substrates were held at 650°C. by heating the susceptor 3 so as to grow thin epitaxial layers of GaAs which was a semiconductor on the substrates. The results of this experiment of vapor-phase growth are shown in FIG. 7. As a comparison, epitaxial layers of GaAs were grown in vapor-phase under the same conditions as described above using the prior art apparatus shown in FIG. 1 and the results are also shown in FIG. 7. The abscissa of the graph shown in FIG. 7 plots the distance from the most upstream end of a substrate as measured on the line connecting said end and the most downstream end of the substrate, and the ordinate plots the rate of film growth on each of the points on the abscissa. As FIG. 7 shows, the prior art barrel type apparatus for vapor-phase growth of a thin semiconductor film produced a great difference between the rates of film growth in the upstream and downstream portions of substrates, and the variation [(standard deviation/mean value)×100] was about 10.0%. In contrast, the apparatus of the present invention produced a much smaller difference and the variation was only about 2.3%, which was an improvement over the prior art by a factor of approximately 5. The mean value of the film growth rate was respectively about 0.8 $\mu$m/h with the prior art apparatus and about 1.0 $\mu$m/h with the apparatus of the present invention, the latter being improved with an approximately 25% over the former. It is therefore clear that the apparatus of the present invention also achieves an improvement in the source material efficiency in addition to the uniformity in growth rate.

As described on the foregoing pages, the apparatus for vapor-phase growth of the present invention offers the advantage of growing an epitaxial layer of uniform thickness on substrates with an improved source material efficiency.

While the invention has been described in detail and with reference to specific embodiments thereof, it will be apparent to one skilled in the art that various changes and modifications can be made therein without departing from the spirit and scope thereof.

What is claimed is:

1. An apparatus for growing a semiconductor film in a substrate vapor-phase growth, comprising:
   . a reactor having an inlet for the introduction of a gas containing a source material into a top portion thereof and a susceptor provided in the downstream portion of the reactor, said susceptor having a conical or polygonal pyramidic shape consisting of an upper rectifying portion and a lower substrate holding portion adapted to hold said substrate, the diameter of the lower portion increasing by a greater degree than in the upper portion.

2. An apparatus according to claim 1, wherein the diameter of the reactor in the portion surrounding the susceptor increases by a progressively increasing degree from its top downward.

3. An apparatus according to claim 1, wherein a rectifying tube with its diameter increasing by a progressively increasing degree from its top downward in the portion surrounding the susceptor is provided in the reactor.

4. An apparatus according to claim 1, wherein said substrate is placed on said substrate holding portion at an angle of from 15° to 80° to the horizontal plane.

* * * * *